(12) United States Patent
Park et al.

(10) Patent No.: US 8,324,060 B2
(45) Date of Patent: Dec. 4, 2012

(54) NAND FLASH MEMORY ARRAY HAVING PILLAR STRUCTURE AND FABRICATING METHOD OF THE SAME

(75) Inventors: Byung Gook Park, Seoul (KR); Seong Jae Cho, Seoul (KR)

(73) Assignee: Seoul National University Industry Foundation (KR)

( * ) Notice: Subject to any disclaimer, the term of this patent is extended or adjusted under 35 U.S.C. 154(b) by 0 days.

(21) Appl. No.: 13/222,246

(22) Filed: Aug. 31, 2011

(65) Prior Publication Data
US 2012/0058619 A1 Mar. 8, 2012

Related U.S. Application Data

(62) Division of application No. 11/629,601, filed as application No. PCT/KR2006/004635 on Nov. 7, 2006, now abandoned.

(30) Foreign Application Priority Data

Jun. 20, 2006 (KR) .......................... 10-2006-0055596

(51) Int. Cl.
*H01L 21/336* (2006.01)
(52) U.S. Cl. ........ 438/301; 438/295; 438/156; 438/514; 438/270; 438/585; 438/517; 438/478; 438/261; 257/324

(58) Field of Classification Search .................. 438/301, 438/295, 156, 514, 270, 585, 517, 478, 261; 257/324
See application file for complete search history.

(56) References Cited

U.S. PATENT DOCUMENTS

| 5,874,760 A | 2/1999 | Burns, Jr. et al. |
| 6,842,370 B2 | 1/2005 | Forbes |
| 6,878,991 B1 | 4/2005 | Forbes |

FOREIGN PATENT DOCUMENTS

| JP | 06-013627 | 1/1994 |
| KR | 10-2005-0013221 | 2/2005 |
| WO | 03/028112 | 4/2003 |

*Primary Examiner* — Junghwa M Im
(74) *Attorney, Agent, or Firm* — Gerald E. Hespos; Michael J. Porco

(57) ABSTRACT

A method is provided for fabricating a NAND flash memory array having vertical channels and sidewall gate structure and a fabricating method of the same. The NAND flash memory array has insulator strip structure and one or more semiconductor strips are next to the both sides of the insulator strip. The NAND flash memory array allows for an improvement of the integrity by decreasing the memory cell area by half and less, and solves the problems of the conventional three-dimensional structure regarding isolation between not only channels but also source/drain regions at the bottom of trenches. The method for fabricating the NAND flash memory array having a pillar structure uses the conventional CMOS process and an etching process with minimum masks, enables to cut down costs.

15 Claims, 14 Drawing Sheets

[Figure 1]
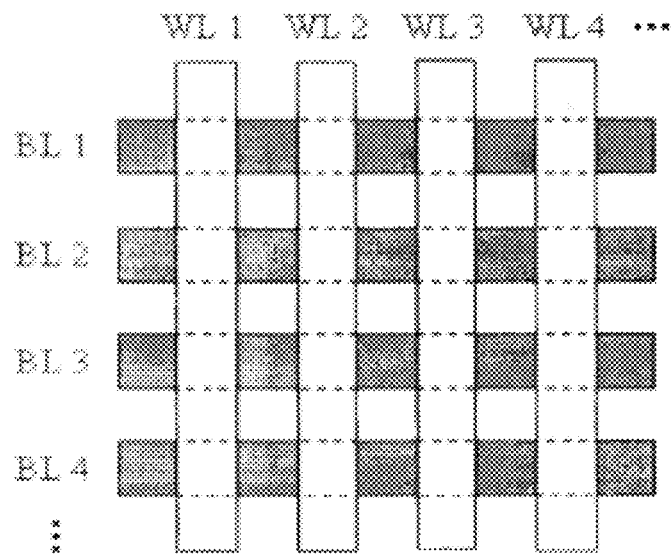
[Figure 2]
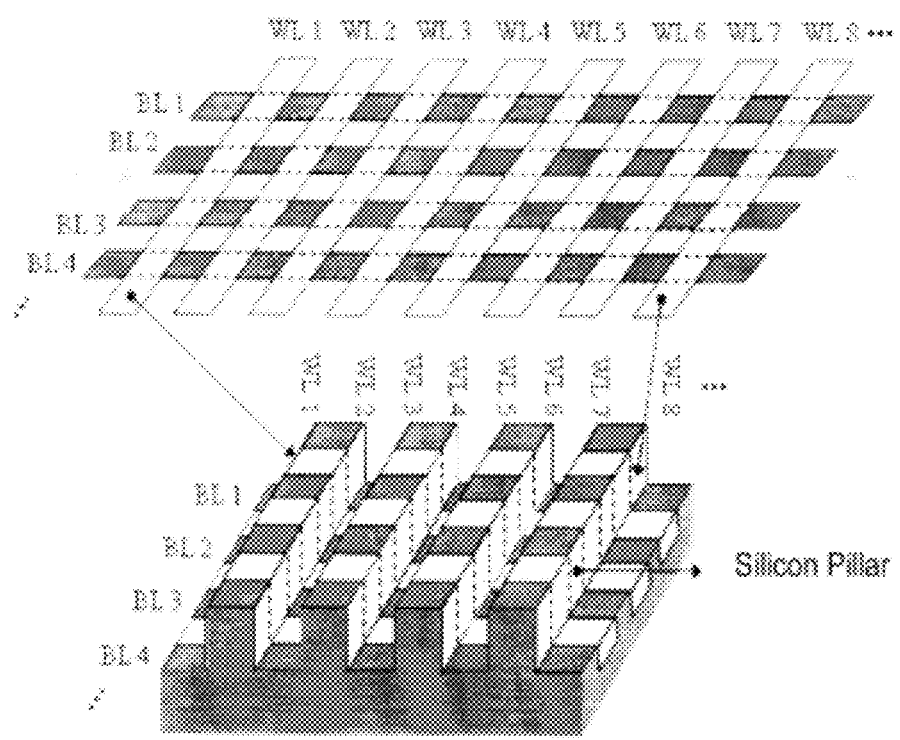

[Figure 3]
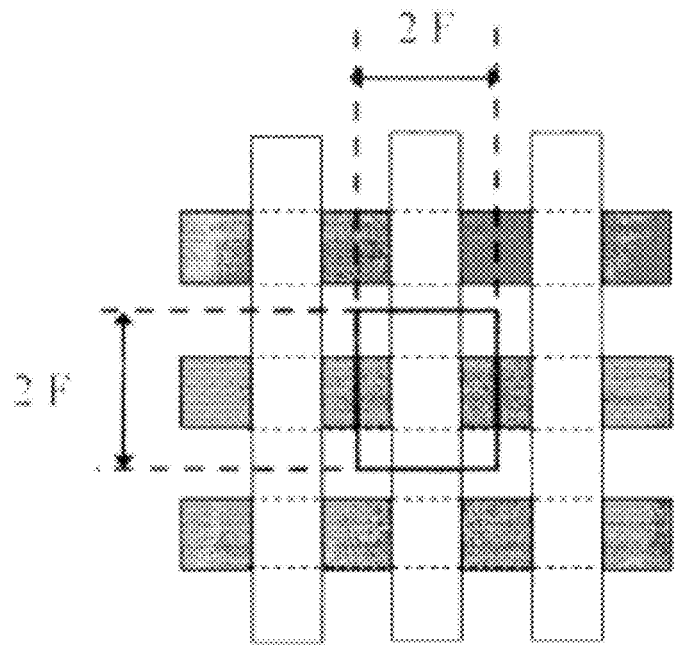
[Figure 4]
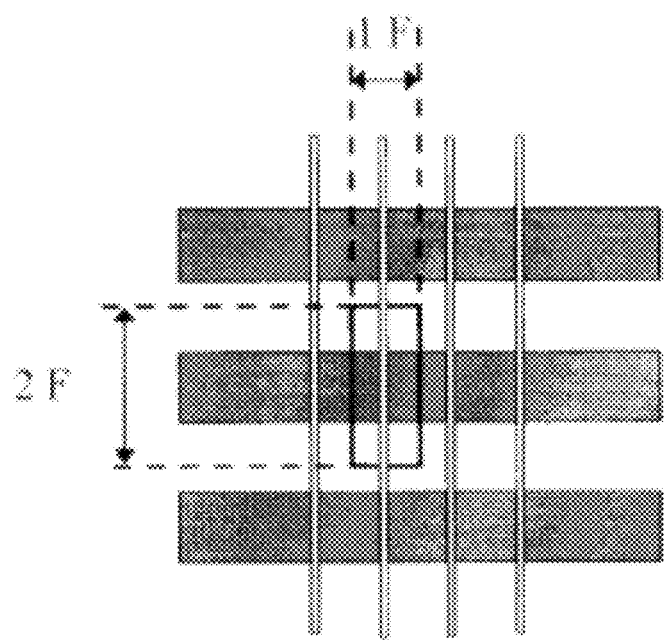

[Figure 9]
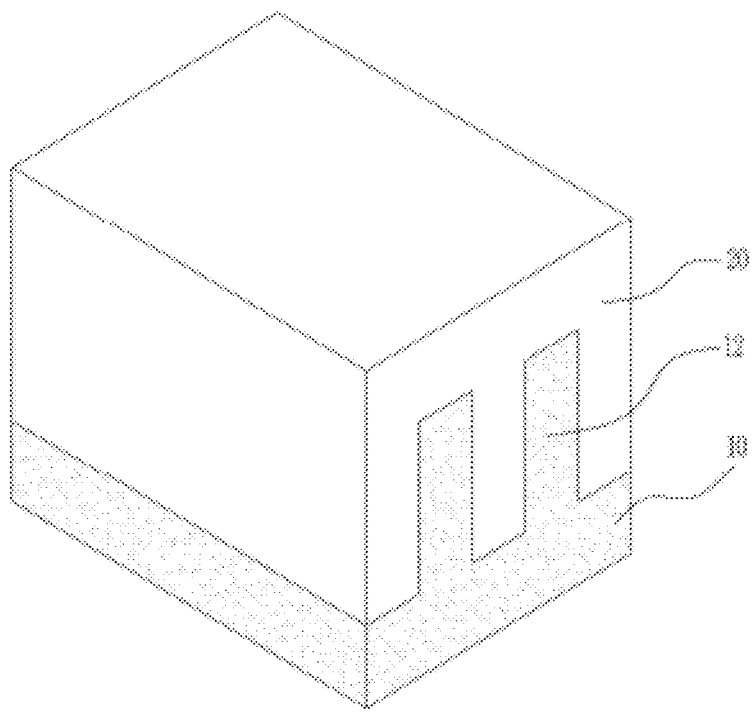
[Figure 10]
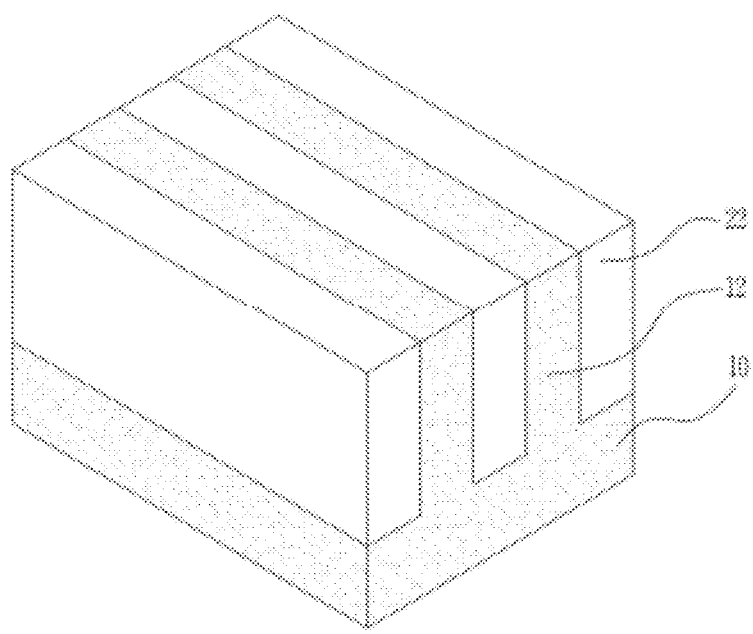

[Figure 11]
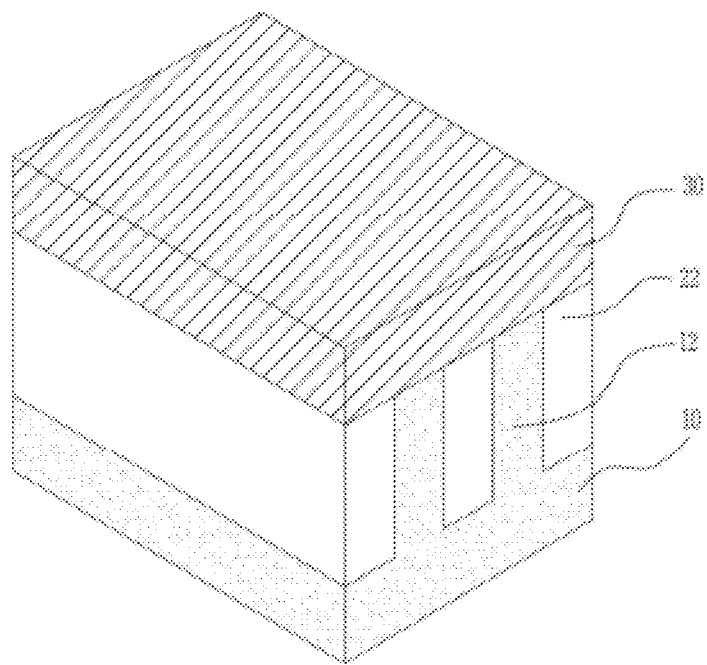
[Figure 12]
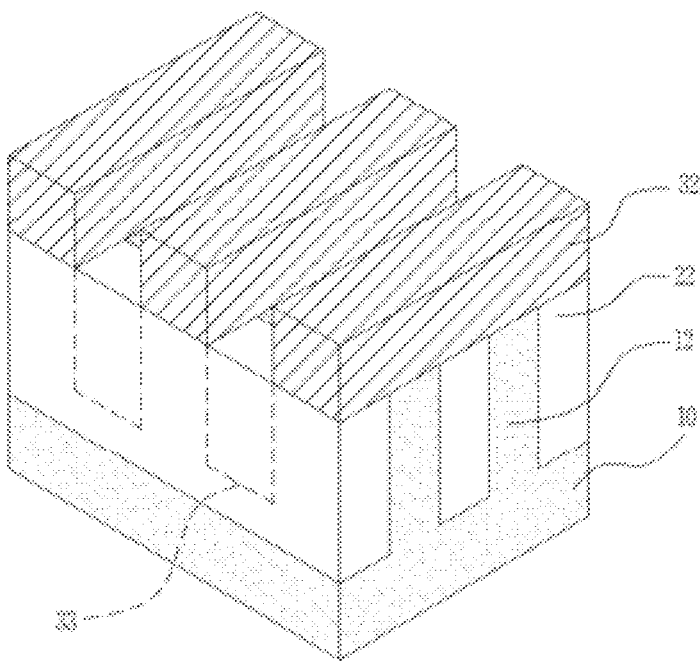

[Figure 13]
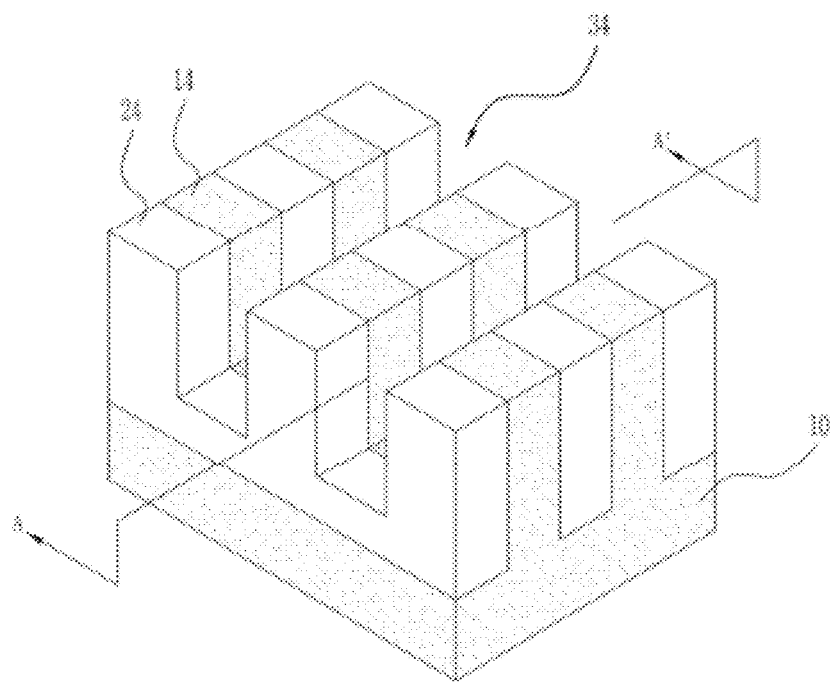
[Figure 14]
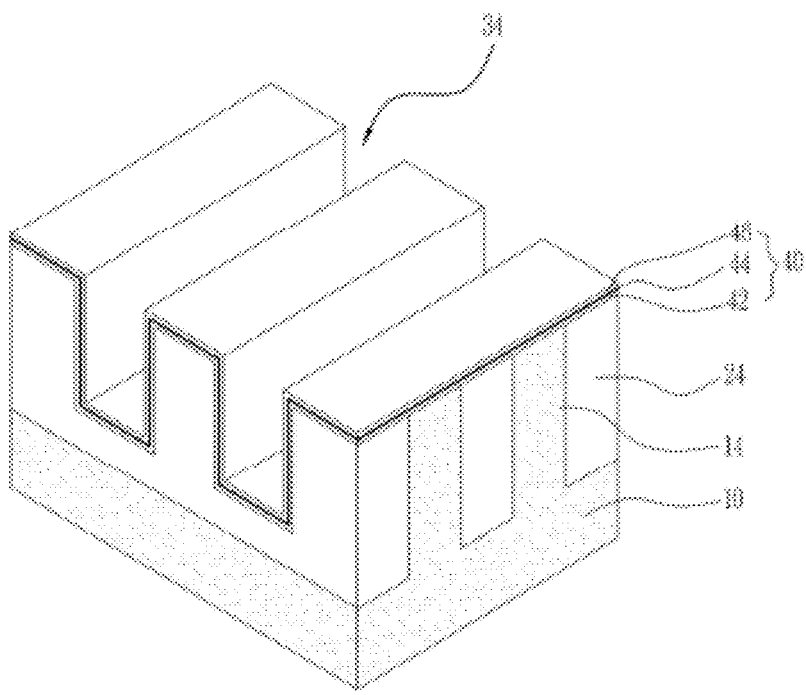

[Figure 15]
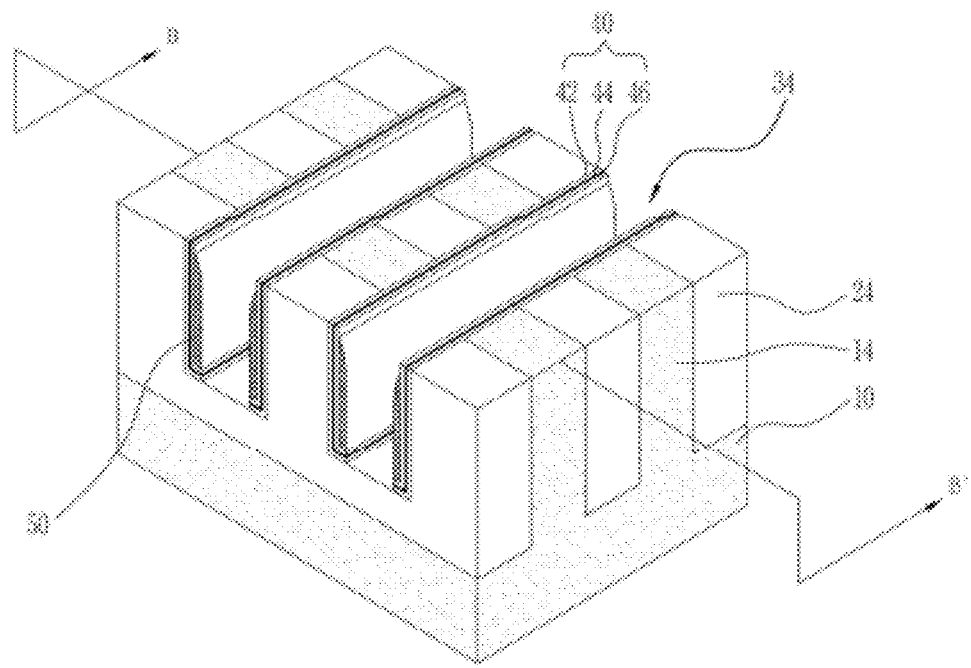
[Figure 16]
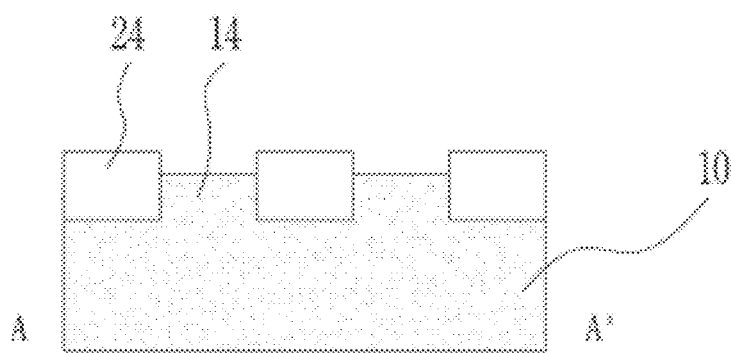

[Figure 17]
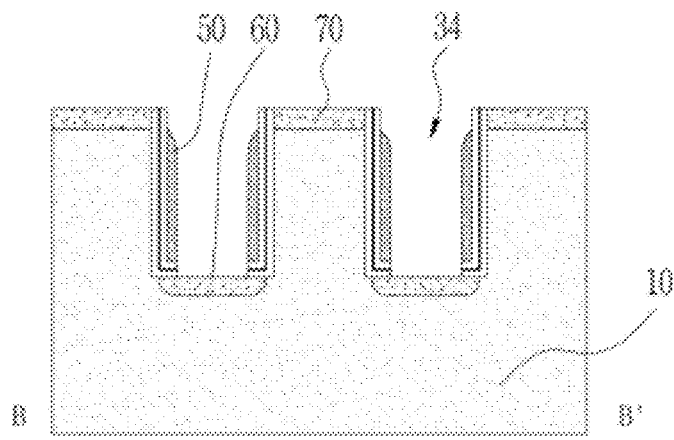
[Figure 18]
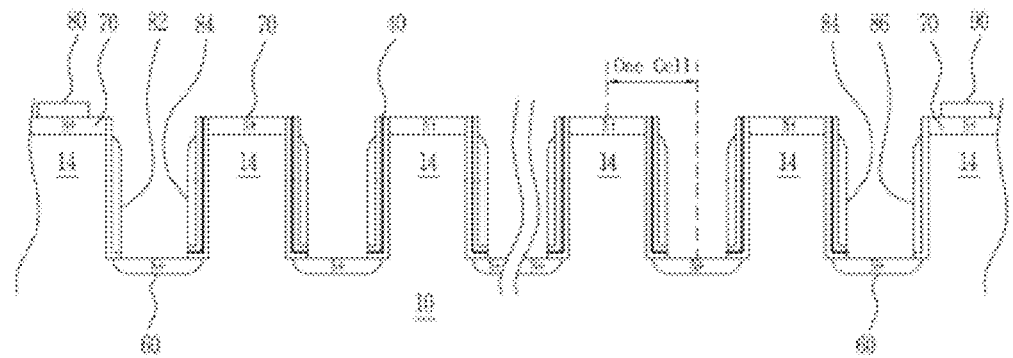
[Figure 19]
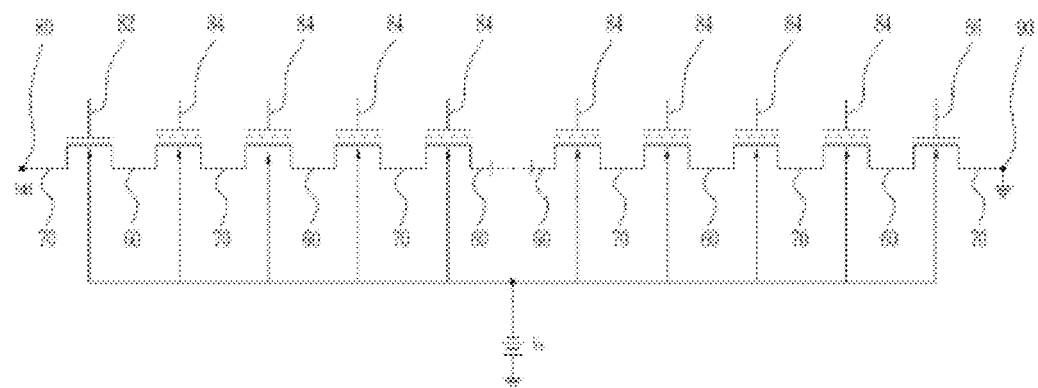

[Figure 20]
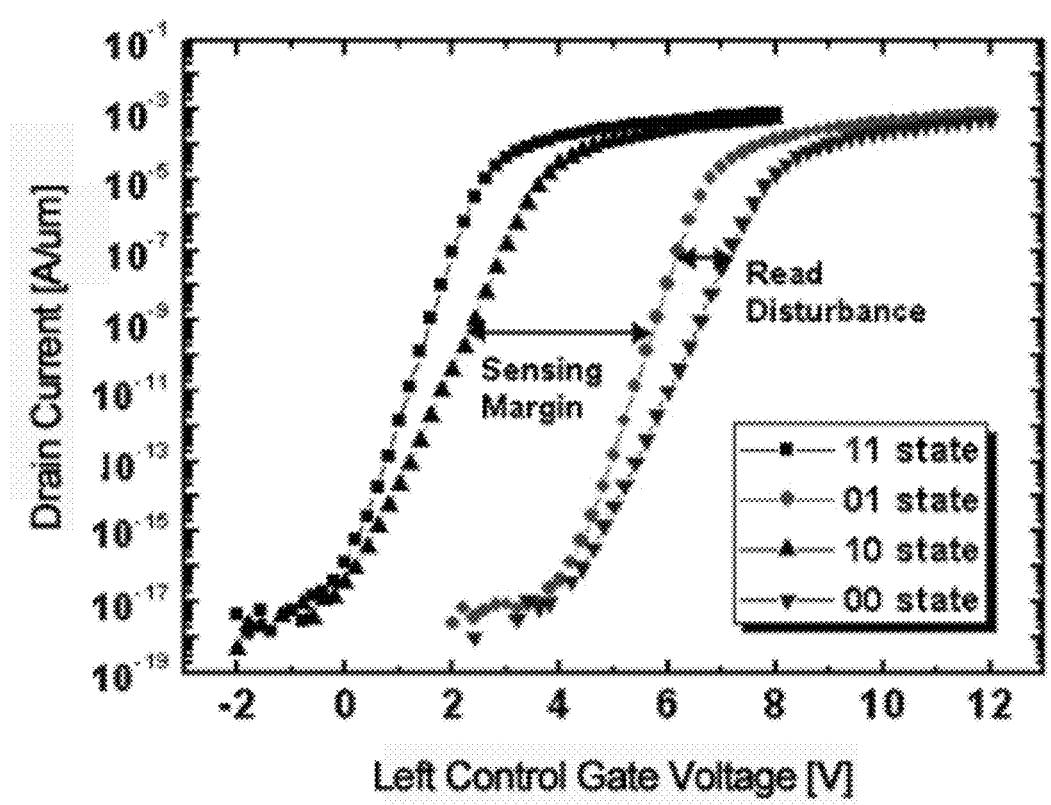

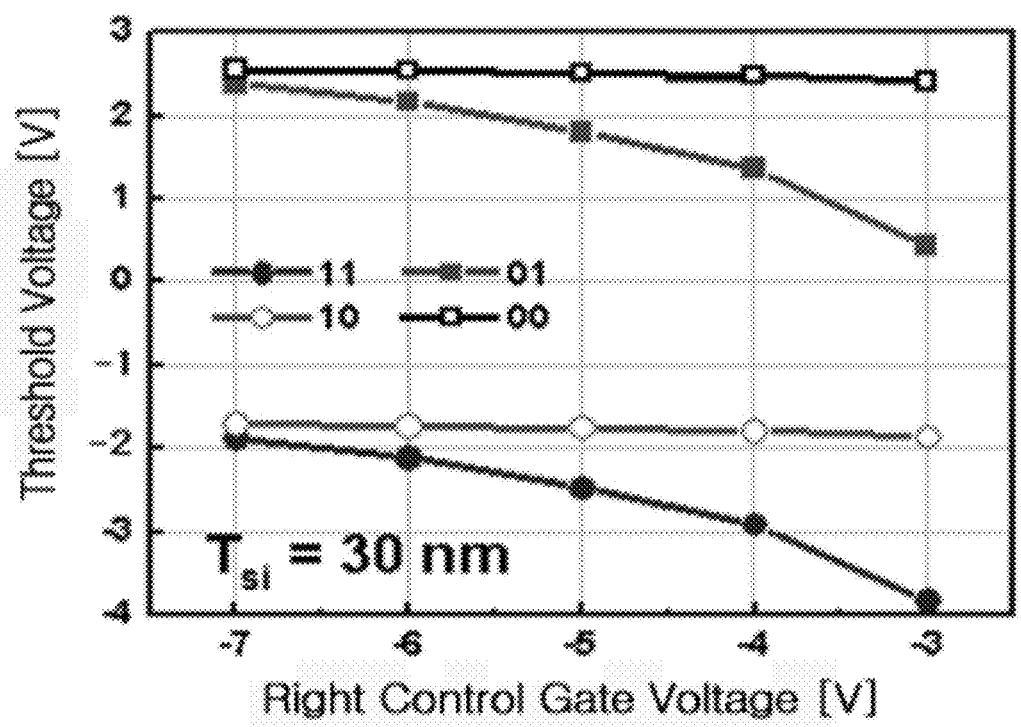
[Figure 21]

[Figure 22]
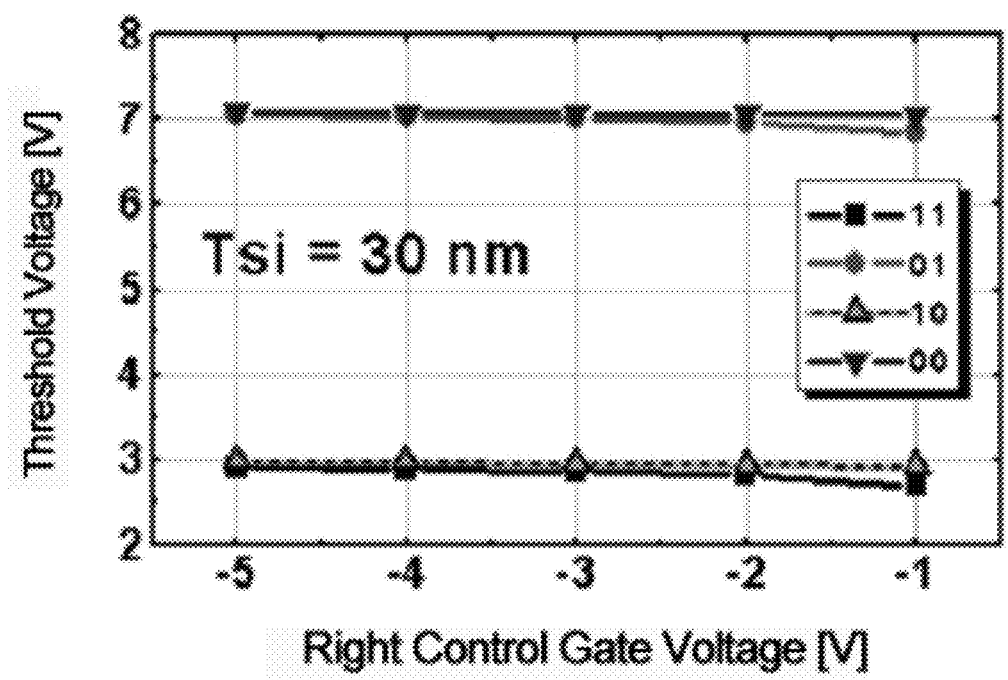

NAND FLASH MEMORY ARRAY HAVING PILLAR STRUCTURE AND FABRICATING METHOD OF THE SAME

CROSS-REFERENCE TO RELATED APPLICATIONS

This application is a divisional of U.S. patent application Ser. No. 11/629,601 filed on Dec. 14, 2006.

BACKGROUND OF THE INVENTION

1. Field of the Invention

The present invention relates to a NAND flash memory array and a fabricating method of the same, and more particularly to a NAND flash memory array having vertical channels and gate structures on sidewalls, wherein memory cells are formed in series on sidewalls of silicon pillars and a fabricating method of the same.

2. Description of the Related Art

These days, flash memories as non-volatile memories have been becoming popular. A conventional flash memory is classified as code flash and data flash, according to its application. In a code flash memory, a NOR type structure flash memory having a short random access time is used. A data flash memory uses a NAND type structure flash memory, which has a short writing time and a high integrity.

Particularly, NAND type flash memories, which have a high integrity because it is unnecessary to form contacts of source and drain on each cells, have been used mainly as large capacity storages in portable disks, digital cameras, video recorders, audio recorders and so on. As times have gone by, demands for NAND type flash memories have been increased.

Therefore, a reduction in cell size and electrical power consumption and a high speed operation have been needed to meet an increase in consumption for NAND flash memories.

Up to now, attempts to promote the degree of integrity of NAND flash memory arrays have been focused mainly on the reduction in cell size, based on planar structure. As a result from such attempts having problems with cell operation, there have been some limitations in improving integrity degree.

Therefore, manufacturers pass over memory arrays having conventional planar structures like FIG. 1, and try rather to develop memory arrays having three-dimensional structures, which embody memory cells by forming trenches on a silicon substrate and using sidewalls of the trenches.

The memory arrays having three-dimensional structures, as shown in FIG. 2, embody word lines on sidewalls as if one crushed the memory array having conventional planar structures into folded array. As a result, as you can see in FIG. 3, the area of one memory cell in a conventional planar structure is 2F×2F=4F2. However, in a three-dimensional structure like FIG. 4, the area is 2F×1F=2F2 only. The three-dimensional structure enables to reduce required areas of total array to a great amount and produce high integrity.

The representative prior art using the three-dimensional structure was described in U.S. Pat. No. 6,878,991.

The prior patent disclosed a floating gate type EEPROM memory. Silicon fins 128 are formed first, as shown in FIG. 5 and a floating gate 122 is formed on a tunnel insulator 120. A source/drain region 126 is formed by ion injection. Reference number 130 means trenches formed between silicon fins 128.

As shown in FIG. 6, one removes silicon fins 128 and poly-silicon, which is floating gates 122 in the direction of bit lines, fills oxide 132 into the area where the silicon fin removed and isolates an adjacent active region.

Then, as shown in FIG. 7, one deposits insulator 124, 142 and forms control gates 106 and select gates 144 respectively on the insulators.

However, the above prior patent has the following problems and it has difficulty in putting to practical use.

First, it is very difficult to isolate channels of cells in the prior invention. To isolate channels and floating gates, as shown in FIG. 6, one should remove silicon fins 128 and poly-silicon which is floating gates 122 by patterning in the direction of bit lines and to do so is not easy. Even if one removed silicon fins 128 and poly-silicon, it is still difficult to fill oxide 132 into the exact area only where the silicon fin removed.

Second, there is no solution for isolation between adjacent bit lines at source/drain regions formed on the bottom of trenches in the prior patent. In words, as shown in FIG. 5, because one forms silicon fins 128 and floating gates 122, injects ions directly and forms source/drain regions 126, there is a possibility that the bottom edges of trenches 130 along the direction of word lines will be coupled electrically to the adjacent bit lines. However, the prior invention did not provide any solution in the following process.

Third, in the prior invention, there must be a process for cutting floating gates, and it is a non-economic process. In the prior invention directed to floating gate types, one should cut floating gates connected in the direction of word lines as shown in FIG. 5, to the direction of each bit lines as shown in FIG. 6 in order to operate cells independently.

DISCLOSURE

Technical Problem

To solve the problems, the present invention is directed to a NAND flash memory array having a pillar structure which enables isolation between not only silicon pillars but also adjacent source/drain regions at the bottom of trenches by embodying a charge trap memory cell on a three-dimensional, pillar memory array (folded memory array).

In addition, the present invention is directed to a method for fabricating the NAND flash memory array having a pillar structure, which uses the conventional CMOS process and enables to cut down costs through a self-align, minimum etching process.

Technical Solution

To achieve the objectives of the present invention, a NAND flash memory array having a pillar structure is characterized by including one or more insulator strips having a pillar structure on a substrate, wherein each pillar is projected at regular intervals; one or more semiconductor strips having a pillar structure between the insulator strips, wherein each pillar is running parallel with the pillar structure of the insulator strips; one or more trenches formed by the one or more insulator strips and the one or more semiconductor strips; two or more dielectric layers including a charge trap layer formed on both sidewalls and a part of bottom of the each trench; sidewall gates formed on the dielectric layers; a first source/drain region formed on the semiconductor strip being on the bottom of the each trench; and a second source/drain region formed on the projected pillar of the each semiconductor strip.

SUMMARY OF THE INVENTION

The present invention provides a method for fabricating a NAND flash memory array having a pillar structure, including the following processes: injecting initial ions into a prepared semiconductor substrate; forming silicon fins on the ion-injected substrate in the direction of bit line; depositing an oxide layer on the substrate in order to isolate between the fins; removing the oxide layer on the silicon fins through a planarization process; coating a photoresist on the substrate, where the upper side of the silicon fins is exposed; patterning the photoresist in the direction of word line; forming trenches with a specific depth and isolated silicon pillars by etching the silicon and the oxide layer along the patterned photoresist and removing the photoresist; forming two or more dielectric layers including a charge trap layer through a continuous deposition process on the whole surface of the substrate where the trenches are formed; forming sidewall gates which are spaced each other on both sides of the trench by depositing conductive materials on the dielectric layers and etching the conductive materials; and forming source/drains by injecting ions into the whole surface of the substrate where the sidewall gates are formed.

Advantageous Effects

The present invention reduces the memory cell area by half and improves the integration very high as compared with the conventional planar structure. According to the present invention, there is no limit for channel length of cell. Therefore, it enables an enough increase in height of a silicon pillar and this allows for an improved sensing margin as well as a control of the conventional short channel effect incidentally.

The present invention provides the complete solution for the isolation problem of a first source/drain region 60 at the bottom of the trench as well as the channel isolation problem of cells, which the conventional three-dimensional structure have, by using insulator strips 24 which are next to the both sides of the each semiconductor strip 14. Also, the present invention allows for a cost down process by using the conventional CMOS process, a self-align and minimum masks for etching process.

BRIEF DESCRIPTION OF THE DRAWINGS

The invention may be better understood by the drawings that are briefly described below and attached hereto, in the several figures of which identical reference numbers (if any) refer to identical or similar elements.

FIG. 1 is a mimetic diagram of a conventional planar NAND flash memory array.

FIG. 2 is a comparative diagram of a conventional planar array and a three-dimensional array of the present invention.

FIG. 3 and FIG. 4 are diagrams for comparing the unit cell area of a conventional planar array and a three-dimensional array of the present invention.

FIG. 8 to FIG. 15 are process perspective views showing the process for the present invention.

FIG. 16 is a cross-section along the section line AA' of FIG. 13.

FIG. 17 is a cross-section along the section line BB' of FIG. 15.

FIG. 18 and FIG. 19 show a cross-section and a structure of an array in an embodiment of the present invention.

FIG. 20 shows an electrical characteristic of read disturbance and sensing margin in an embodiment of the present invention.

FIG. 21 shows an electrical characteristic of the influence of the negative voltage at the right control gate on the threshold voltage at the left cell when the thickness of a silicon pillar is 30 nm and the concentration of P-type dopant of the pillar is $5\times10^{15}/cm^3$.

FIG. 22 shows an electrical characteristic of the influence of the negative voltage at the right control gate on the threshold voltage at the left cell when the thickness of a silicon pillar is 30 nm and the concentration of P-type dopant of the pillar is $3\times10^{18}/cm^3$.

Figure 5:
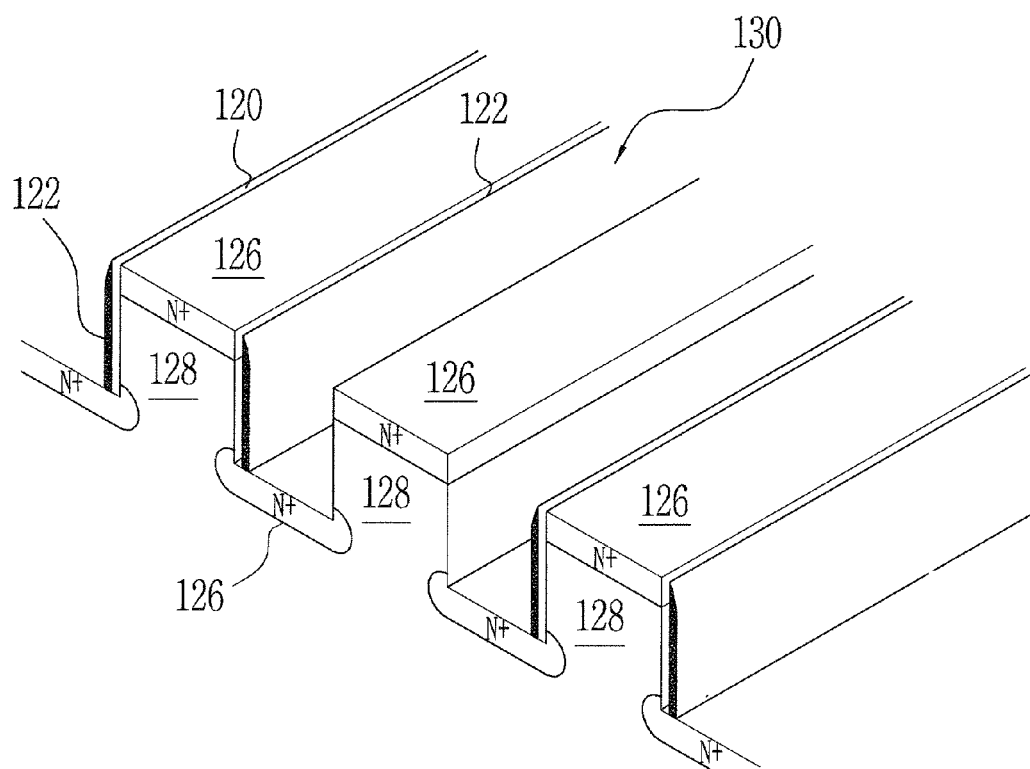
FIG. 5 to FIG. 7 are process perspective views showing the process for a conventional three-dimensional structure.
Figure 6:
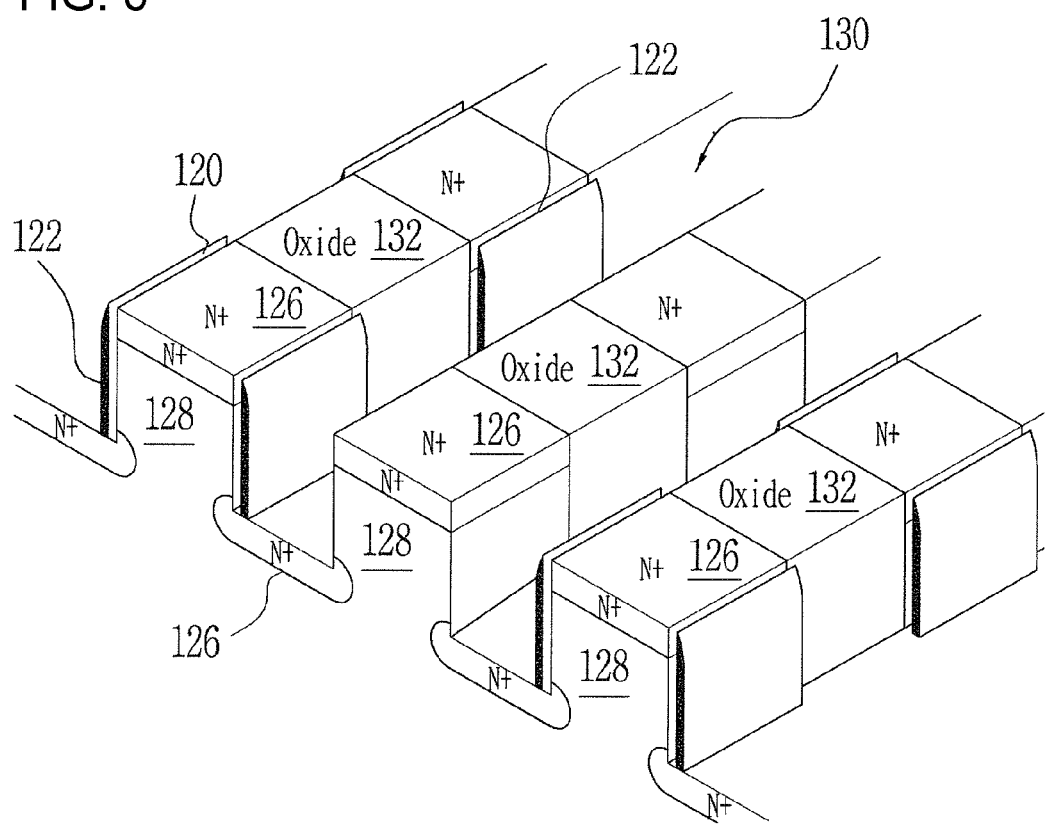
Figure 7:
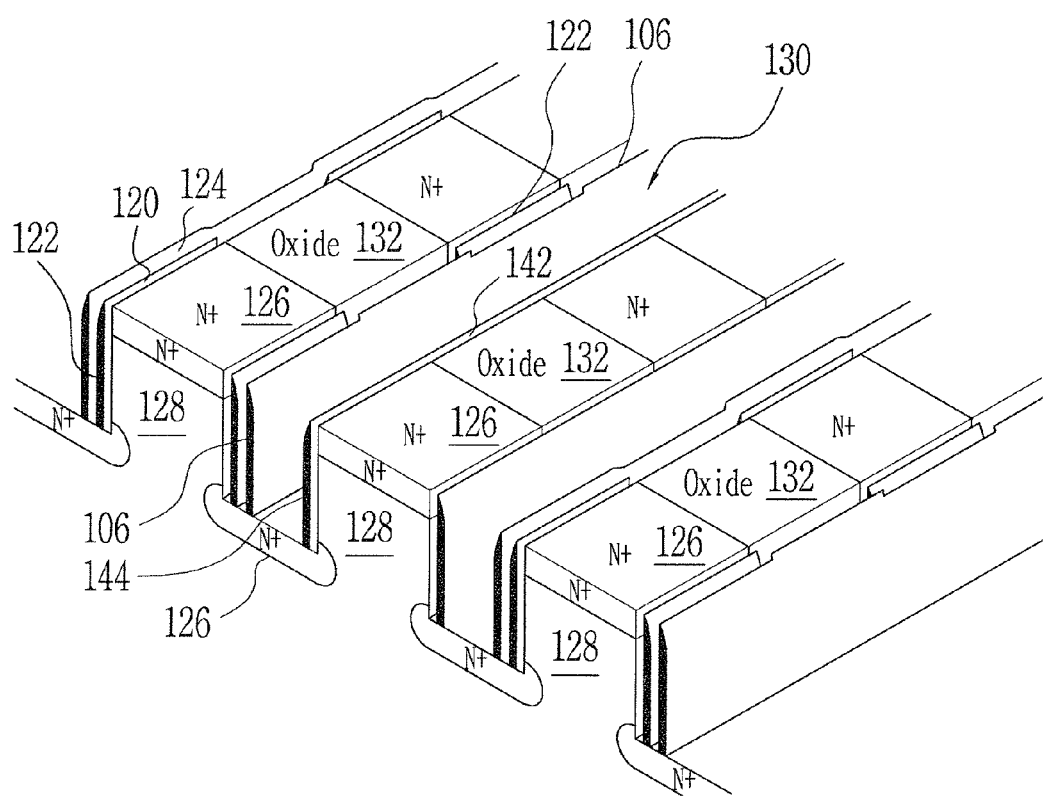

In these drawings, the following reference numbers are used throughout: reference number 10 indicates a semiconductor substrate (excluding silicon fins), 12 means a silicon fin, 20 and 22 mean an insulating layer, 30 and 32 mean a photoresist, 33 means the part to be etched shown in dotted line, 34 means a trench, 40 means an OTO (Oxide-Trap-Oxide) layer, 50 means a sidewall gate, 60 means a first source/drain region, 70 means a second source/drain region, 80 means a bit line contact, 82 means a first select gate, 84 means a control gate, 86 means a second select gate, and 90 means a source line contact.

DETAILED DESCRIPTION OF THE PREFERRED EMBODIMENTS

A detailed description of preferred embodiments of the present invention is provided below with respect to the accompanying drawings.

For one embodiment, the invention provides a NAND flash memory array having a pillar structure, as shown in FIGS. 13, 15, and 17, which includes one or more insulator strips 24 having a pillar structure on a substrate 10, wherein each pillar is projected at regular intervals; one or more semiconductor strips 14 having a pillar structure between the insulator strips 24, wherein each pillar is running parallel with the pillar structure of the insulator strips; one or more trenches 34 formed by the one or more insulator strips 24 and the one or more semiconductor strips 14; two or more dielectric layers 40 for example, an OTO layer of an oxide layer 42-a charge trap layer 44-a oxide layer 46, formed on both sidewalls and a part of bottom of the each trench 34; sidewall gates 50 formed on the dielectric layers; a first source/drain region 60 formed on the semiconductor strip 14 being on the bottom of the each trench 34; and a second source/drain region 70 formed on the projected pillar of the each semiconductor strip 14.

One or more semiconductor strips 14 and a semiconductor substrate 10 are originally in one united body. However, the adjacent parts those are next to and correspond to one or more insulator strips 24 are designated as the semiconductor strips 14.

Therefore, the present invention is characterized by the structure that performs effectively not only the channel isolation of cells but also the isolation of a first source/drain region 60 at the bottom of a trench using the insulator strips 24 which are next to both sides of the each semiconductor strip 14.

For another embodiment, as shown in FIG. 18, on the second source/drain region 70 formed on one side of the each semiconductor strip 14, a bit line contact 80 is formed; a sidewall gate formed along one sidewall of a pillar of the each semiconductor strip 14 where the bit line contact 80 is formed, is a first select gate 82 and is connected to a first select line; on the second source/drain region 70 formed on the other side of the each semiconductor strip 14, a source line contact 90 is formed; a sidewall gate formed along one sidewall of a pillar of the each semiconductor strip where the source line contact is formed, is a second select gate 86 and is connected to a second select line; and one or more sidewall gates between the first select gate 82 and the second select gate 86 are one or more control gates 84 and are connected to each word line.

FIG. 19 shows an array structure corresponding to FIG. 18. In FIG. 19, the voltage Vdd is applied to the bit line contact 80, the source line contact is the ground state, and the substrate voltage (body voltage) applied to the each device is designated as VB.

A sidewall gate 50 of FIG. 17 becomes a control gate 84 as shown in FIG. 18. In the meantime, a single oxide layer is preferable as a gate insulating layer for operating a first select gate 82 and a second select gate 86 easily, as shown in FIG. 18. For process convenience's sake, the two or more dielectric layers 40 which are the same as the gate insulating layer of the control gate 84 can be used.

For another embodiment, on the both sides of the projected pillar of the semiconductor strip 14, memory cells, which can be operated by the each control gate 84, are formed, and the memory cells are connected in series along the bit line.

It is preferable that the two or more dielectric layers 40 formed on both sidewalls and a part of bottom of the each trench 34 include a charge trap layer, which is a nitride layer or is composed of other charge trap materials such as nanocrystals and high-k materials. This is because large amount of deep level traps in the charge trap layer can be used as a charge repository and inside the charge trap layer, electrons injected on programming hardly migrate horizontally, are distributed mainly to the site where electrons are injected and are maintained their state and an electrical isolation between adjacent cells can be obtained automatically.

Therefore, for the two or more dielectric layers, an OTO layer comprising a control oxide 46, a charge trap layer 44, and a tunneling oxide layer (a grown SiO2 layer) 42 or a TO layer comprising a charge trap layer and a tunneling oxide layer (a grown SiO2 layer) can be used often. Especially, when a nitride layer is used for the charge trap layer, the former becomes the SONOS (Silicon-Oxide-Nitride-Oxide-Silicon) or the MONOS (Metal-Oxide-Nitride-Oxide-Silicon) structure and the latter becomes the MNOS (Metal-Nitride-Oxide-Silicon) structure. The control oxide can be a chemical vapor deposited silicon oxide or further other high-k materials such as Al2O3.

It is preferable that the projected pillars of the each semiconductor strip 14 and the projected pillars of the each insulator strip 24 are square pillars as shown in FIG. 15.

In this case, the thickness (t) of the projected square pillar of the semiconductor strip 14 should be decided in consideration of the disturbance effect in accordance with the other memory cell condition when one memory cell is read.

Read disturbance means the variation of a required control gate voltage to generate equal read current. The variation is generated when the read operation of one cell is dependent on the programming state or the erasing state of the other cell in two memory cells formed on both sides of the silicon pillar. Strictly speaking, the read disturbance is paired cell interference (PCI) in view of the fact that it arise from the interference between paired cells of the silicon pillar.

To explain the read disturbance more clearly, when "0" stands for the programming state and "1" stands for the erasing state, we can express states of a left cell and a right cell as 00, 01, 10, 11 (first number means state of a left cell and second number means state of right cell). When a left cell is in a read mode, if the state of a left cell is independent on the state of a right cell, the read current at 00 can be the same as the read current at 01 and the read current at 10 can be the same as the read current at 11. However, as shown in FIG. 20, the read current at 00 is lower than the read current at 01 in reality. Therefore, to make the read current at 00 equal to the read current at 01, higher voltage may be applied to a left control gate. This difference in voltage is referred to as "read disturbance."

Therefore, the read disturbance is a very important parameter to determine the thickness of a silicon square pillar having cells at both sides. To minimize the read disturbance, a silicon square pillar should be thick, and then the area of arrays may be large. Therefore, there is a tradeoff.

In one embodiment of the present invention, we found out that we could reduce the read disturbance by not only controlling the thickness of the silicon square pillar, but also applying a negative voltage to the opposite control gate or increasing the concentration of impurities dopants at the silicon pillar.

We got the results of FIGS. 21 and 22 from simulations about the effect on the read disturbance of parameters, such as the thickness of a square pillar, the concentration of dopant of a pillar, and the negative voltage at the opposite control gate. FIGS. 21 and 22 show the influence of the negative voltage at the right control gate on the threshold voltage at the left cell when the thickness of a silicon pillar is 30 nm and the concentration of P-type dopant of the pillar is 5×1015/cm3 (FIG. 21) and 3×1018/cm3 (FIG. 22) respectively.

From the results of FIGS. 21 and 22, when the thickness of a silicon pillar is 30 nm, we found that to maintain the read disturbance within 1V, we should apply a negative voltage of −4V and lower to the right control gate at low concentration of P-type dopant of the pillar as 5×1015/cm3. However, when the concentration of P-type dopant of the pillar is high as 3×1018/cm3, we can maintain the read disturbance within 1V without negative biasing at the right control gate.

When we increase the concentration of dopant of the pillar (channel), the read disturbance may diminish, but the running current also may get small and this makes sensing difficult. Therefore, in the real process, we can set the thickness of a silicon square pillar as about 50 nm and the concentration of a dopant of a silicon pillar as 1×1016/cm3.

It is preferable to reduce the read disturbance that the thickness of a silicon square pillar is 30~50 nm and that the concentration of a dopant of a pillar is 1×1016/cm3~3×1018/cm3.

However, the thickness of a silicon square pillar and the concentration of a dopant can be different depending on other variables such as negative biasing of the opposite control gate. Therefore, it is to be understood that other variables which control the read disturbance may be included in the spirit and scope of the present invention.

There is no limit for the height of a silicon pillar (the channel length) in the present invention. Therefore, it enables an enough increase in height of a silicon pillar and this allows for an improved sensing margin.

The difference in a control gate voltage to be applied for generating the specific current between programmed and erased state of a cell is defined as "sensing margin". In FIG. 20, for generating a drain current of 10−7 A/μm, a required control gate voltage is about 2V at the erased state and about 6V at the programmed state, and therefore sensing margin is 4V.

For another embodiment, the invention provides a method of fabricating a NAND flash memory array having a pillar structure, with respect to the drawings FIGS. 8 to 15.

First, initial ions are injected into the prepared semiconductor substrate.

The semiconductor substrate is preferable to be a P-type silicon substrate, but it is not to be taken in a limiting sense, and other semiconductor substrate may be used. Read disturbance hereafter is considered into injecting initial ions into the prepared semiconductor substrate, and it is preferable to inject initial ions for consideration the thickness of a silicon square pillar to be fabricated.

In words, in case that the thickness of a silicon square pillar is 30~50 nm, the concentration of P-type impurities dopants of the pillar is preferable to be 1×1016/cm3~3×1018/cm3.

When the height of a silicon pillar is under consideration, it is preferable to control injection energy in order to inject ions by the height of the silicon pillar at least.

Figure 8:
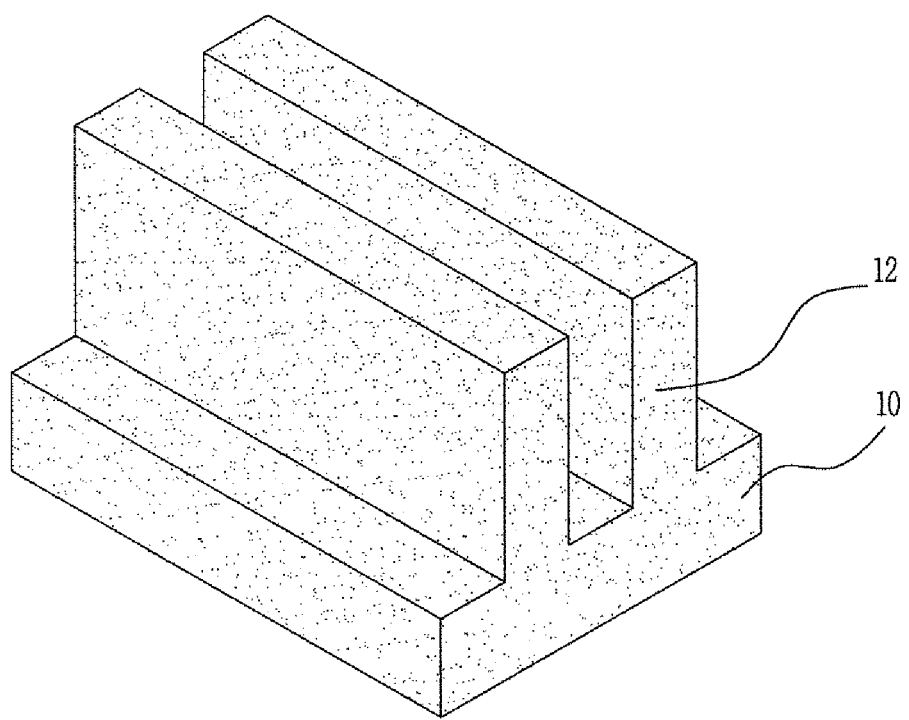

As shown in FIG. 8, silicon fins 12 are formed on the ion injected substrate in the direction of bit line. Reference number 10 means a silicon substrate except for the silicon fins 12.

In one embodiment for forming the silicon fins 12, it comprises depositing an oxide layer and a nitride layer on the ion injected substrate orderly; patterning for etching mask through a photolithography or an e-beam process on the nitride layer; and etching silicon along the patterned mask.

Also, patterning for etching mask through a photolithography or an e-beam process directly on the ion-injected substrate without depositing an oxide layer and a nitride layer on the ion injected substrate orderly can be processed.

Depositing an oxide layer and a nitride layer orderly has an intention of using a nitride layer as an etching stopper in the CMP (Chemical Mechanical Polish) process.

Etching silicon is the same as the conventional CMOS process, and detailed description for this is omitted here. However, when sensing margin is under consideration, it is preferable that the height of silicon fins 12 is high enough as 100 nm and more.

Next, as shown in FIG. 9, in order to isolate between fins 12, an oxide layer 20 is deposited on the substrate.

There is no any limit for depositing an oxide layer 20. However, it should be noted to plan a process that during high temperature process using a furnace, some silicon is eaten through an oxidation process, the width of the silicon fins becomes narrow, and injected ions are redistributed.

Therefore, it is preferable to proceed depositing an oxide layer 20 at low temperature. It is more preferable to use the PECVD (Plasma Enhancement Chemical Vapor Dposition) using TEOS (tetra-ethyl-orthosilicate, Si(OC2H5)4).

Next, as shown in FIG. 10, the oxide layer 20 on the silicon fins 12 is removed by a planarization process.

A planarization process is for revealing and planarizing bent which are generated from the silicon fins 12 by depositing an oxide layer 20 in order to the next process. As a result, oxide layers 22 with the same height as of the silicon fins 12 exist among the silicon fins 12.

The CMP (Chemical Mechanical Polish) process is preferable for the planarization process. Etching stopper can be a nitride layer (not shown in FIG.) on the silicon fins 12.

Then, as shown in FIG. 11, a sensitive film is deposited on the substrate, where the silicon fin 12 is exposed. And, as shown in FIG. 12, the sensitive film 30 is patterned in the direction of word line.

Coating a photoresist and pattering it are the same as the conventional CMOS process, and detailed descriptions are omitted here.

Next, as shown in FIGS. 12 and 13, one or more trenches with a specific depth are formed by etching the silicon fins 12 and the oxide layers 22 along the patterned photoresist 32.

Here, the important thing in etching the silicon fins 12 and an oxide layers 22 is to control etching time, etching gas and so on in order to leave some parts of the oxide layers 22 at the bottom of the trench and form one or more insulator strips 24 having a pillar structure in which pillars are projected in the direction of bit line.

Etching the silicon fins 12 and the oxide layers 22 is dry etching and follows the well-known method. Considering the height of the oxide layer 22 and an etching rate, we have only to leave some parts of the oxide layer 22 at the bottom of the trenches 34.

Etching the silicon fins 12 and etching the oxide layers 22 is proceeded with the same photoresist mask one after the other and it is not easy to control the etching rate perfectly. Therefore, as shown in FIG. 16, after etching and cutting along AA' of FIG. 13, there may be a slight difference in heights between an insulator strip 24 and a semiconductor strip 14. This difference may not be a problem if it is controlled on making a control gate on the sidewall. A hard mask with one layer or two layers can be used under the photoresist mask in order to prepare for the case that the photoresist mask cannot stand it during etching silicon and an oxide layer orderly.

Then, after removing the photoresist mask 32, trenches 34 with a specific depth and isolated silicon pillars 14 are formed as shown in FIG. 13.

Further, as shown in FIG. 14, two or more dielectric layers, OTO layers 40, are formed through a continuous deposition process on the whole surface of the substrate where the trenches 34 are formed.

The continuous deposition process for forming two or more dielectric layers has to include depositing a charge trap layer to be used for a charge repository.

The continuous deposition process for forming two or more dielectric layers such as OTO layers 40 in FIG. 14 is the same as the conventional process and detailed description is omitted here.

Next, sidewall gates 50 are formed apart from each other on both sides of the trench 34 by depositing conductive materials on the OTO layers 40 and etching the conductive materials, as shown in FIG. 15.

The conductive materials can be metals as well as polysilicon. Etching the conductive materials is anisotropic etching.

Finally, source/drains 60, 70 are formed by injecting ions into the trenches 34, where the sidewall gates 50 are formed, and the whole upper side of the pillar, as shown in FIG. 17. FIG. 17 is a cross-section along the section line BB' of FIG. 15 after injecting ions.

The injecting ions of forming source/drains can be performed after removing OTO layers 40 on the pillar or before removing the OTO layers 40.

The ions are N-type. Injecting ions are the same as the conventional ions injecting process and detailed description about this is omitted here. However, when the height of a silicon pillar is under consideration, it is necessary to control the angle for ions injection.

After injecting ions and treating appropriate heat process, source/drains 60, 70 are formed, as shown in FIG. 17.

So far, the preferable embodiments of the present invention has been described herein, however, it will be evident that the present invention cannot be defined only by the described embodiments herein and it will be understood that the invention herein described are generally applicable, and executed as various modified embodiments by those skilled in the art. For example, the shape and the thickness of the silicon pillar and the concentration of dopants can be various within the spirit and scope of the present invention.

INDUSTRIAL APPLICABILITY

The present invention relates to a NAND flash memory array having vertical channels and sidewall gate structure and a fabricating method for the same. A NAND flash memory array of the present invention has one or more semiconductor strips which are next to the both sides of each insulator strip. A NAND flash memory array of the present invention allows for an improvement of the integrity by decreasing the memory cell area by half and less, and solves the problems of the conventional three-dimensional structure regarding isolation between not only channels but also source/drain regions at the bottom of trenches. A method for fabricating the NAND flash memory array having a pillar structure, which uses the conventional CMOS process and an etching process with minimum masks, enables to cut down costs.

What is claimed is:

1. A method of fabricating a NAND flash memory array having a pillar structure, including:
    injecting initial ions into a prepared semiconductor substrate;
    forming silicon fins on the ion-injected substrate in the direction of bit line;
    depositing an oxide layer on the substrate in order to isolate between the fins;
    removing the oxide layer on the silicon fin through a planarization process;
    coating a photoresist on the substrate, where the upper side of the silicon fins is exposed;
    patterning the photoresist in the direction of word line;
    forming trenches with a specific depth and isolated silicon pillars by etching the silicon and the oxide layer along the patterned photoresist and removing the photoresist;
    forming two or more dielectric layers including a charge trap layer through a continuous deposition process on the whole surface of the substrate where the trenches are formed;
    forming sidewall gates which are spaced each other on both sides of the trench by depositing conductive materials onto the dielectric layers and etching the conductive materials; and
    forming source/drains by injecting ions into the whole surface of the substrate where the sidewall gates are formed.

2. The method of claim 1,
wherein forming the silicon fin further comprises:
    depositing an oxide layer and a nitride layer onto the ions-injected substrate orderly;
    patterning the nitride layer; and
    forming silicon fin by etching a silicon along the patterned mask.

3. The method of claim 2,
wherein the planarization process is the CMP process.

4. The method of claim 3,
wherein the continuous deposition process of forming two or more dielectric layers includes depositing a nitride layer as the charge trap layer.

5. The method of claim 1,
wherein etching the silicon fins and the oxide layers for forming trenches is characterized that some parts of the oxide layer are remained at the bottom of the trench and that the oxide layer formed one or more insulator strips having a pillar structure in which pillars are projected in the direction of bit line.

6. The method of claim 5,
wherein the conductive materials of forming the sidewall gates are poly-silicon or metals, and etching the conductive materials is anisotropic etching.

7. The method of claim 5,
wherein injecting ions of forming the source/drains is performed after removing the dielectric layers at the bottom of the trench and on the fins or before removing the dielectric layers.

8. The method of claim 2,
wherein etching the silicon fins and the oxide layers for forming trenches is characterized that some parts of the oxide layer are remained at the bottom of the trench and that the oxide layer formed one or more insulator strips having a pillar structure in which pillars are projected in the direction of bit line.

9. The method of claim 8,
wherein the conductive materials of forming the sidewall gates are poly-silicon or metals, and etching the conductive materials is anisotropic etching.

10. The method of claim 3,
wherein etching the silicon fins and the oxide layers for forming trenches is characterized that some parts of the oxide layer are remained at the bottom of the trench and that the oxide layer formed one or more insulator strips having a pillar structure in which pillars are projected in the direction of bit line.

11. The method of claim 10,
wherein the conductive materials of forming the sidewall gates are poly-silicon or metals, and etching the conductive materials is anisotropic etching.

12. The method of claim 4,
wherein etching the silicon fins and the oxide layers for forming trenches is characterized that some parts of the oxide layer are remained at the bottom of the trench and that the oxide layer formed one or more insulator strips having a pillar structure in which pillars are projected in the direction of bit line.

13. The method of claim 12,
wherein the conductive materials of forming the sidewall gates are poly-silicon or metals, and etching the conductive materials is anisotropic etching.

14. The method of claim 1,
wherein the projected pillars of the each semiconductor strip and the projected pillars of the each insulator strip are square pillars,
the thickness of the projected square pillar of the semiconductor strip is 30~50 nm, and
the concentration of impurities doped to the projected square pillar of the semiconductor strip is $1 \times 10^{16} \sim 3 \times 10^{18}/cm^3$.

15. The method of claim 2,
wherein the projected pillars of the each semiconductor strip and the projected pillars of the each insulator strip are square pillars,
the thickness of the projected square pillar of the semiconductor strip is 30~50 nm, and
the concentration of impurities doped to the projected square pillar of the semiconductor strip is $1 \times 10^{16} \sim 3 \times 10^{18}/cm^3$.

* * * * *